United States Patent
Son et al.

(10) Patent No.: US 11,569,367 B1
(45) Date of Patent: Jan. 31, 2023

(54) GRAPHENE LHFETS (LATERAL HETEROSTRUCTURE FIELD EFFECT TRANSISTORS) ON SI COMPATIBLE WITH CMOS BEOL PROCESS

(71) Applicant: HRL Laboratories, LLC, Malibu, CA (US)

(72) Inventors: Kyung-Ah Son, Malibu, CA (US); Jeong-Sun Moon, Moorpark, CA (US); Hwa Chang Seo, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 0 days.

(21) Appl. No.: 17/242,276

(22) Filed: Apr. 27, 2021

Related U.S. Application Data

(60) Provisional application No. 63/116,719, filed on Nov. 20, 2020.

(51) Int. Cl.
| | |
|---|---|
| *H01L 21/00* | (2006.01) |
| *H01L 29/66* | (2006.01) |
| *H01L 29/16* | (2006.01) |
| *H01L 29/167* | (2006.01) |
| *H01L 29/786* | (2006.01) |
| *H01L 27/12* | (2006.01) |
| *H01L 21/223* | (2006.01) |
| *H01L 29/40* | (2006.01) |

(Continued)

(52) U.S. Cl.
CPC ...... *H01L 29/66045* (2013.01); *H01L 21/223* (2013.01); *H01L 27/1218* (2013.01); *H01L 27/1222* (2013.01); *H01L 29/1606* (2013.01); *H01L 29/167* (2013.01); *H01L 29/401* (2013.01); *H01L 29/78603* (2013.01); *H01L 29/78684* (2013.01); *H01L 21/0228* (2013.01); *H01L 21/02178* (2013.01); *H01L 21/02181* (2013.01); *H01L 21/02205* (2013.01); *H01L 21/02381* (2013.01); *H01L 21/02488* (2013.01); *H01L 21/02527* (2013.01); *H01L 21/02617* (2013.01); *H01L 29/4908* (2013.01)

(58) Field of Classification Search
CPC ............ H01L 29/66045; H01L 21/223; H01L 27/1218; H01L 27/1222; H01L 29/1606; H01L 29/167; H01L 29/401; H01L 29/78603; H01L 29/78684; H01L 21/02178; H01L 21/02181; H01L 21/0228; H01L 21/02381; H01L 21/02488; H01L 21/02527; H01L 21/02617; H01L 29/4908

See application file for complete search history.

(56) References Cited

U.S. PATENT DOCUMENTS

| | | | |
|---|---|---|---|
| 9,064,964 B2 | 6/2015 | Moon | |
| 9,324,804 B2 * | 4/2016 | Lagally | ................. H01L 29/161 |

(Continued)

OTHER PUBLICATIONS

"Lateral Graphene Heterostructure Field-Effect Transistor" IEEE Electron Device Letters, vol. 34, No. 9, Sep. 2013 Jeong S. Moon et al.

*Primary Examiner* — Richard A Booth
(74) *Attorney, Agent, or Firm* — Ladas & Parry, LLP

(57) ABSTRACT

A field effect transistor includes a substrate, a passivation layer on the substrate forming a passivated substrate, wherein the passivation layer is inert to $XeF_2$, and a graphene lateral heterostructure field effect transistor (LHFET) on the passivated substrate.

21 Claims, 8 Drawing Sheets

(51) Int. Cl.
*H01L 21/02* (2006.01)
*H01L 29/49* (2006.01)

(56) References Cited

U.S. PATENT DOCUMENTS

| 11,222,959 | B1* | 1/2022 | Moon | H01L 21/3115 |
| 2014/0239257 | A1* | 8/2014 | Moon | H01L 29/1054 |
| | | | | 257/29 |

* cited by examiner

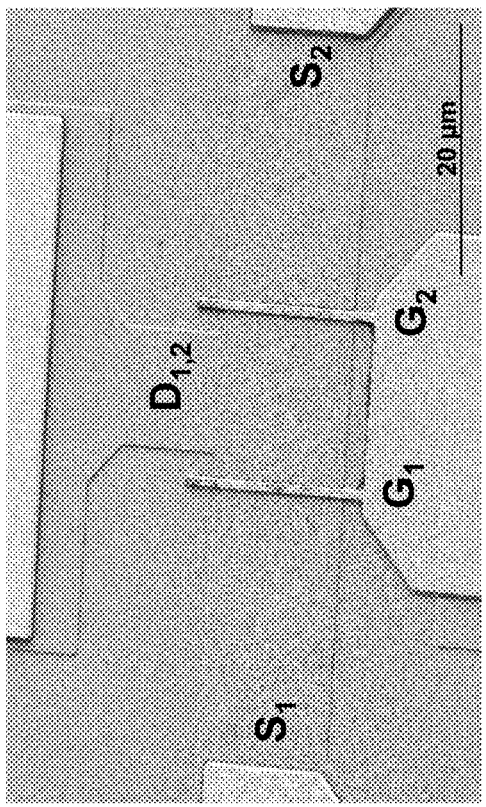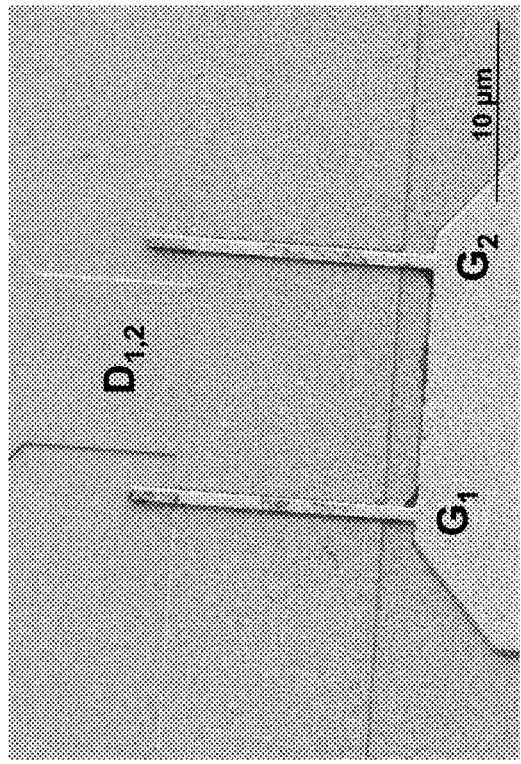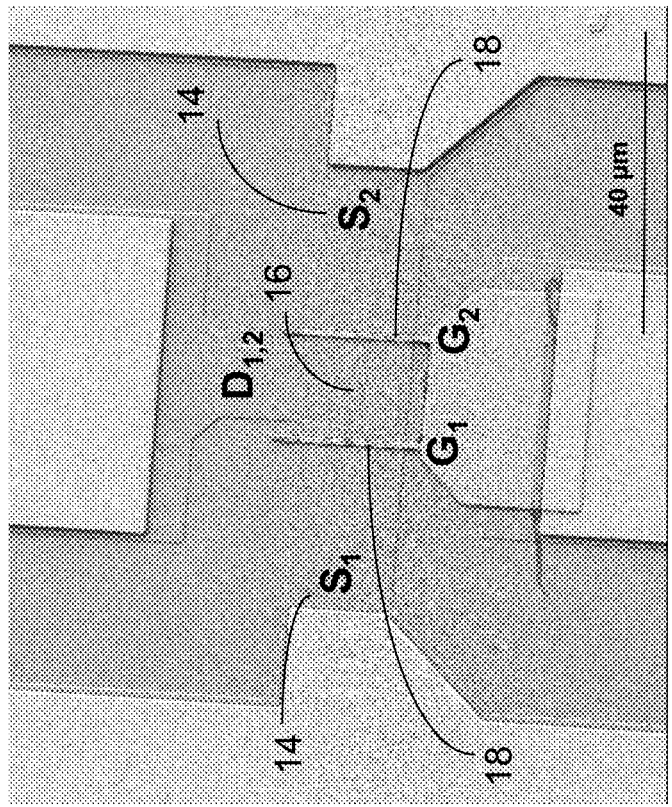
FIG. 5A
FIG. 5B
FIG. 5C

GRAPHENE LHFETS (LATERAL HETEROSTRUCTURE FIELD EFFECT TRANSISTORS) ON SI COMPATIBLE WITH CMOS BEOL PROCESS

CROSS REFERENCE TO RELATED APPLICATIONS

This application is related to and claims the benefit of U.S. Provisional Patent Application Ser. No. 63/116,719, filed Nov. 20, 2020, which is hereby incorporated herein by reference.

STATEMENT REGARDING FEDERAL FUNDING

This invention was made with U.S. Government support under contract N000294882. The U.S. Government may have certain rights in this invention.

TECHNICAL FIELD

This disclosure relates to heterostructure field effect transistors.

BACKGROUND

In the prior art, graphene lateral heterostructure field effect transistors (LHFETs) were developed with epitaxial graphene grown on silicon carbide (SiC) substrates. These prior art LHFETs have had limited utility. Further, because those prior art graphene LHFETs are on SiC substrates, integration with complementary metal-oxide semiconductor (CMOS) circuits, which are generally on Si substrates, is not feasible.

Jeong S. Moon et al. describe a prior art graphene LHFET in "Lateral Graphene Heterostructure Field-Effect Transistor" IEEE Electron Device Letters, VOL. 34, NO. 9, September 2013, which is hereby incorporated herein by reference as though set forth in full. A prior art graphene LHFET is also described in U.S. Pat. No. 9,064,964, issued Jun. 23, 2015 titled "Graphene Heterostructure Field Effect Transistors", which is hereby incorporated herein by reference as though set forth in full. This prior art graphene LHFET suffered from severe etching of the silicon substrate and of other device structures on the substrate during fluorination of the graphene.

What is needed is an improved graphene LHFET which can be easily integrated with complementary metal-oxide semiconductor (CMOS) circuits. The embodiments of the present disclosure answer these and other needs.

SUMMARY

In a first embodiment disclosed herein, a field effect transistor comprises a substrate, a passivation layer on the substrate forming a passivated substrate, wherein the passivation layer is inert to $XeF_2$, and a graphene lateral heterostructure field effect transistor (LHFET) on the passivated substrate.

In another embodiment disclosed herein, a method for providing a field effect transistor comprises providing a substrate, forming a passivation layer on the substrate to form a passivated substrate, wherein the passivation layer is inert to $XeF_2$, and forming graphene lateral heterostructure field effect transistor (LHFET) on the passivated substrate.

In yet another embodiment disclosed herein, a method for providing a field effect transistor comprises providing a substrate, passivating the substrate on a front side, a backside, and edges with an ALD grown deposition of a dielectric material inert to $XeF_2$ to form a passivated substrate, transferring or depositing graphene over the passivated substrate using a transfer method, patterning the transferred graphene with photolithography and dry etching to create a graphene mesa, forming a source contact on a first section of the graphene mesa, forming a drain contact on a second section of the graphene mesa, fluorinating with $XeF_2$ a section of the graphene mesa between the source contact and the drain contact to form a fluorinated graphene section on the graphene mesa between the first section of the graphene mesa and the second section of the graphene mesa, depositing a gate oxide over the fluorinated graphene section, and forming a gate electrode over the gate oxide.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIGS. 5A, 5B and 5C show SEM images of two fabricated graphene LHFETs with ohmic contacts for source and drain electrodes fabricated on a graphene mesa and gate electrodes fabricated over the graphene mesa in accordance with the present disclosure.

DETAILED DESCRIPTION

Figure 1:
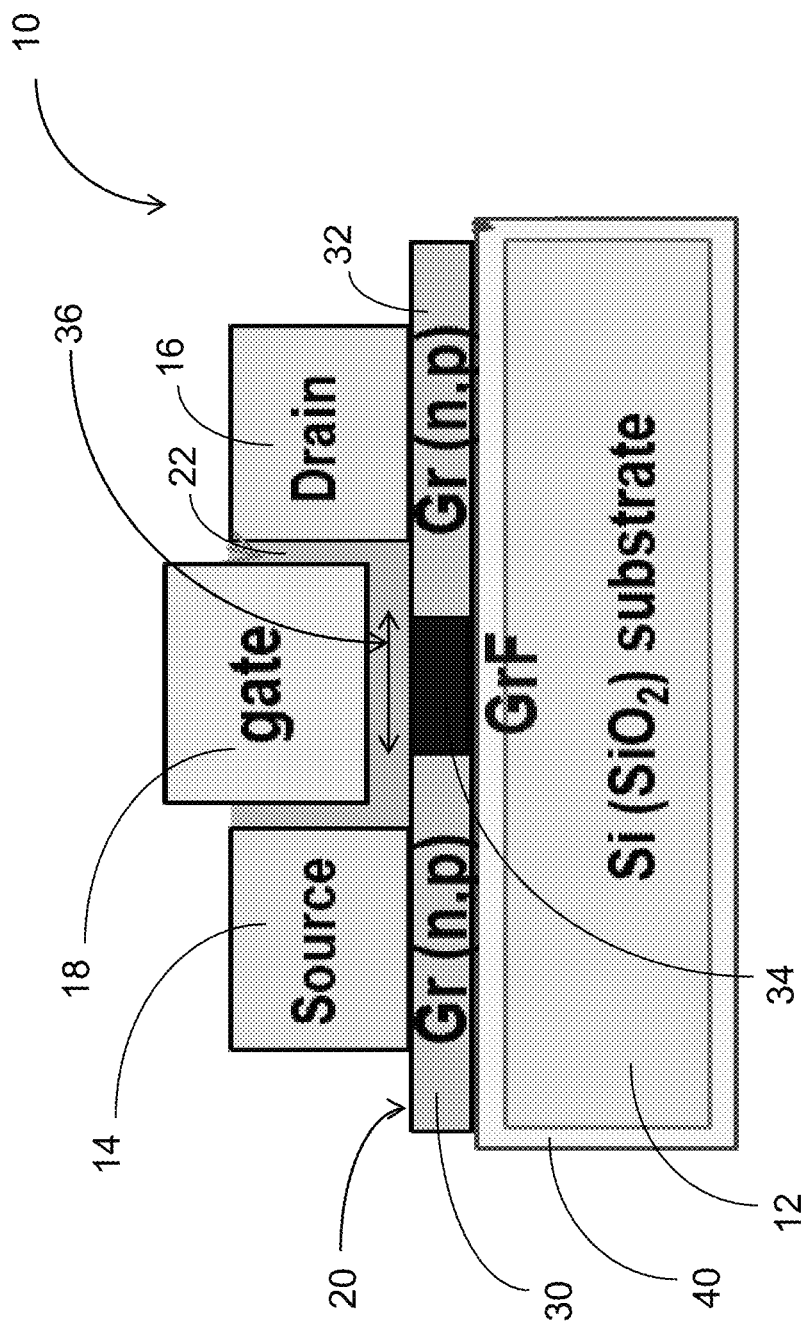
FIG. 1 shows a cross-section of a graphene LHFET fabricated on a Si substrate in accordance with the present disclosure.

The following description is presented to enable one of the ordinary skill in the art to make and use the invention and to incorporate it in the context of particular applications. Various modifications, as well as variety of uses in different applications, will be readily apparent to those skilled in the art, and the general principles defined herein may be applied to a wide range of embodiments. Thurs, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35U.S.C. Section 112, Paragraph 6. In particular, the use of "step of" or "act of" in the claims herein is not intended to invoke the provisions of 35 U.S.C. 112, Paragraph 6.

The present disclosure describes a graphene lateral heterostructure field effect transistor (LHFET). The graphene LHFET may be fabricated on a Si substrate and the fabrication processes are compatible with Si CMOS back-end-of-line (BEOL) processes, which is a significant advantage over the prior art. The graphene LHFET of the present disclosure enables wafer-scale monolithic integration of graphene LHFETs with Si CMOS circuits, including 3-dimensional (3D) trusted secure integrated circuits (ICs).

Further, graphene LHFETs potentially enable reverse engineering (RE) transparent embedded logic circuits, and also potentially enable high-density monolithic three dimensional (3D) secure ICs with a very low performance overhead. For example, wafer-scale graphene lateral heterostructure FETs (LHFETs) on Si substrates, fabricated using CMOS BEOL compatible processes, can potentially enable high-performance and transparent embedded logic switches. The embedded logic switches can provide the functionalities of authentication and validation of devices and circuits in non-active regions of the circuits, allowing logic-based trusted and secure ICs.

FIG. 1 shows a cross-section of a graphene lateral heterostructure field effect transistor (LHFET) 10 fabricated on a substrate 12 in accordance with the present disclosure. The LHFET 10 has a source contact 14, a drain contact 16, and a gate electrode 18 between the source contact 14 and the drain contact 16. A lateral heterostructure graphene channel 20 extends below the source contact 14, the drain contact 16 and the gate electrode 18. The gate electrode 18 is electrically isolated and insulated from the source contact 14, the drain contact 16, and the lateral heterostructure graphene channel 20 by a gate oxide 22. The lateral heterostructure graphene channel 20 has a first graphene section Gr 30 in contact with the source contact 14 and a second graphene section Gr 32 in contact with the drain contact 16. The first graphene section 30 and the second graphene section 32 may each be doped with n-type doping, or each be doped with p-type doping. In between the first graphene section 30 and the second graphene section 32, the lateral heterostructure graphene channel 20 has a fluorinated graphene section GrF 34. The first graphene section 30, the second graphene section 32 and the fluorinated graphene section 34 are electrically isolated and insulated from the gate 18 by gate oxide 22.

The fluorinated graphene section 34 has a wide bandgap, and serves as an electric potential barrier to lateral carrier transport in the lateral heterostructure graphene channel 20 between the source 14 and the drain 16. By applying a voltage on the gate 18, the electric potential barrier can be modulated thereby modulating a source-drain current $I_{ds}$ to provide a transistor function. The length 36 of the fluorinated graphene section 34 can be scaled as needed to provide transistor scalability.

The substrate 12 may be a Si or $SiO_2$ wafer, which is passivated with a dielectric film 40 that is inert to $XeF_2$. The dielectric film 40 may be formed or grown using atomic layer deposition (ALD). The dielectric film 40 may be $HfO_2$, $Al_2O_3$, or other materials that are inert to $XeF_2$. By encapsulating the substrate with a $XeF_2$-inert dielectric layer, the present disclosure has solved a long standing problem with prior art graphene LHFETs. During manufacturing of the prior art graphene LHFETs, the step of fluorination of the graphene layer has resulted in severe etching of the substrate and other devices on the substrate resulting in a less than desirable graphene LHFET. For example, ohmic contacts in the prior art graphene LHFETs suffered damage during fluorination.

After passivating the substrate 12 with the dielectric film 40, a chemical vapor deposition (CVD)-grown graphene is transferred or deposited onto the passivated substrate 12 using a transfer method.

All the fabrication steps used are compatible with conventional CMOS processes. The fabrication steps used for the graphene LHFETs on Si substrates of the present disclosure are also compatible with conventional Si CMOS back-end-of-line (BEOL) processes for micro-electronic, electro-optic, or electro-mechanical device fabrication.

The method for providing a graphene LHFET on a Si substrate is as follows. First, a Si or $SiO_2$ substrate/wafer 12 is passivated over the front side, the backside, and the edge with an ALD-grown $XeF_2$ inert dielectric material 40, such as $HfO_2$ or $Al_2O_3$, which is inert to $XeF_2$. A precursor may be used for $HfO_2$ and the precursor may be tetrakis(dimethylamido)hafnium(IV) ($TDMAH_f$).

The deposition temperature of an ALD-grown $XeF_2$ inert dielectric material 40 may range from 150° C. to 250° C., and may be preferably 250° C. It is important that the dielectric layer 40 be free of pinhold defects, and the dielectric 40 may be 50-200 nanometers (nm) thick.

The deposition of the dielectric material 40 on the substrate 12 is compatible with BEOL CMOS processes, which may have a thermal budget of less than 500° C., and preferably less than 350° C.

After the substrate has been passivated with dielectric material 40, graphene is then transferred or deposited using a wet-transfer method over the substrate 12 encapsulated with the ALD dielectric material 40. Then the graphene is doped to be either n-type, or p-type.

Figure 2:
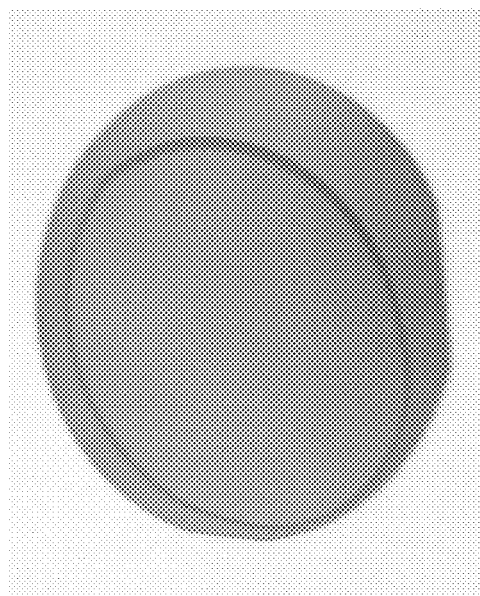
FIG. 2 shows a photograph of a Si substrate encapsulated with an ALD-grown $HfO_2$ film in accordance with the present disclosure.
Figure 3A:
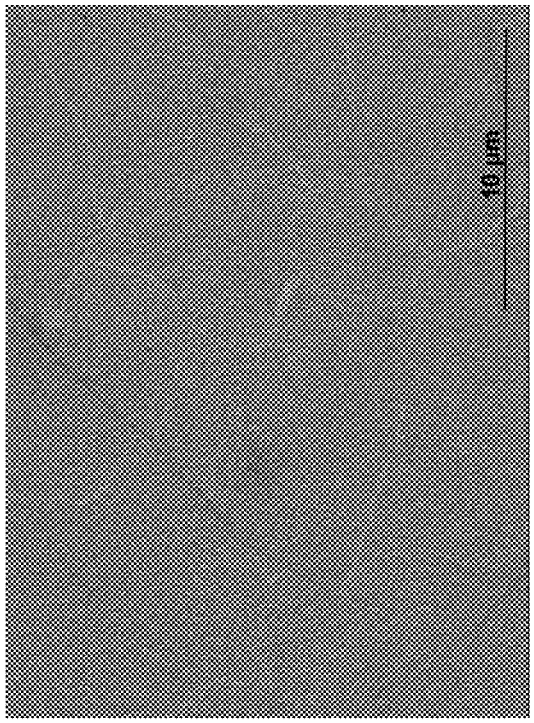
FIGS. 3A, 3B and 3C show scanning electron microscope (SEM) images of CVD graphene transferred onto a $HfO_2$ passivated Si substrate in accordance with the present disclosure.
Figure 3B:
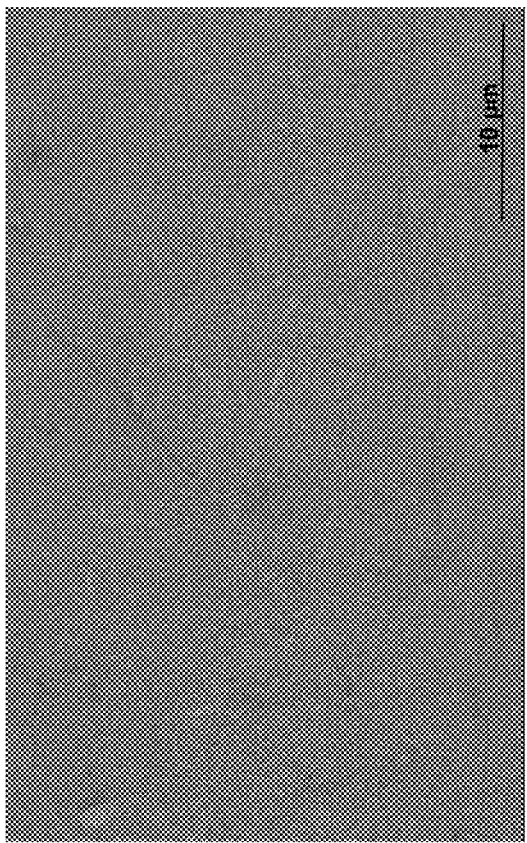
Figure 3C:
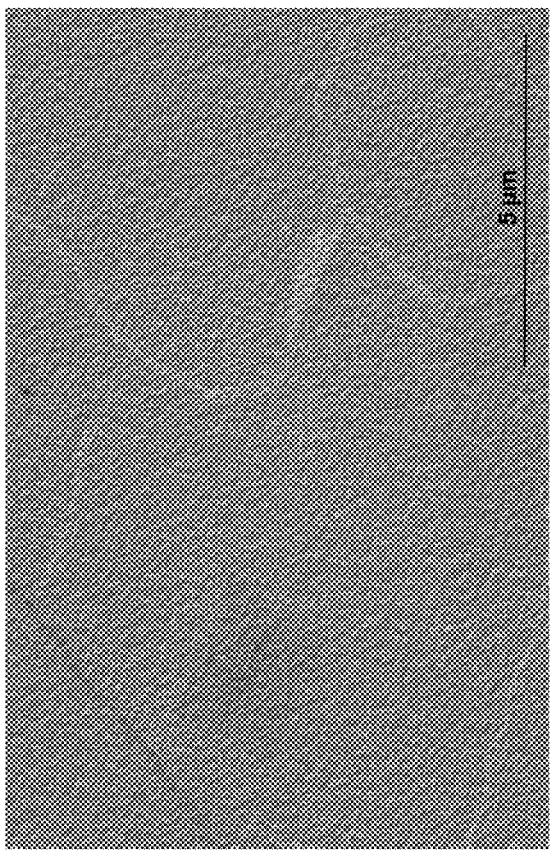

FIG. 2 shows a photograph of a $SiO_2$ substrate passivated with an ALD $HfO_2$. FIGS. 3A, 3B and 3C show scanning electron microscope (SEM) images of CVD graphene transferred over the $HfO_2$-passivated substrate. The transferred graphene then is patterned using optical lithography and etched using an oxygen plasma-based dry etching method to form a graphene mesa.

Figure 4A:
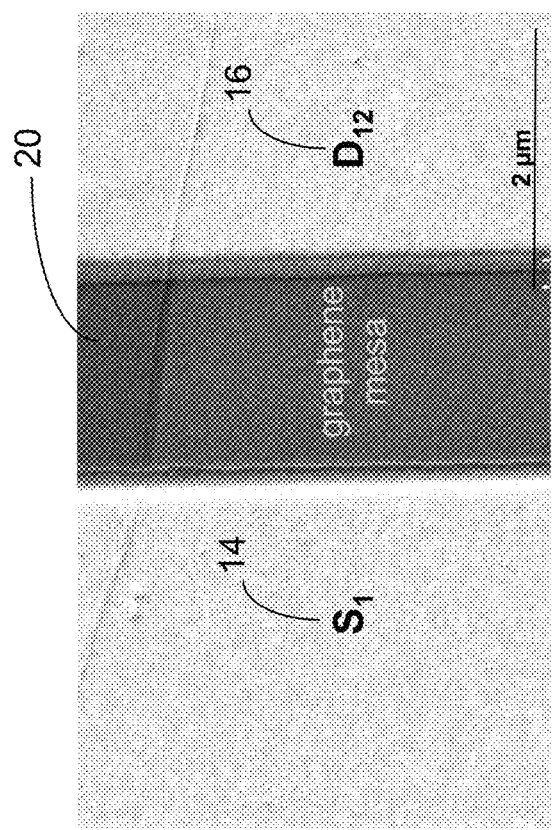
FIGS. 4A, 4B and 4C are SEM images of a partially fabricated LHFET showing a graphene mesa and ohmic contacts for source and drain electrodes in accordance with the present disclosure.
Figure 4B:
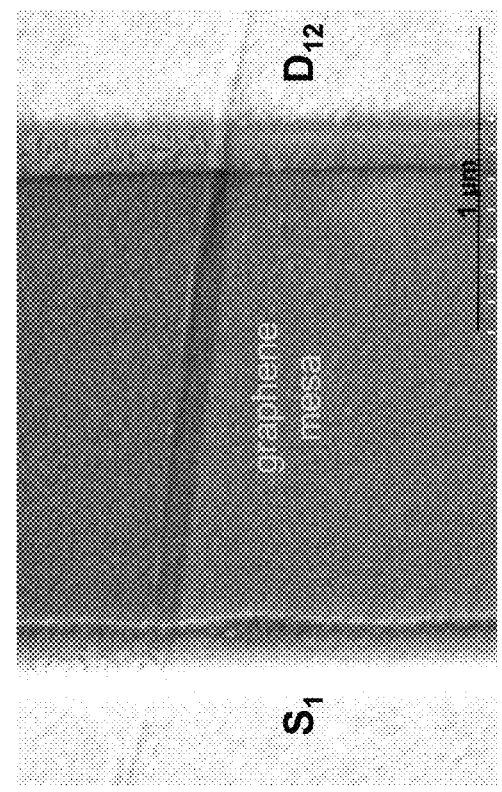
Figure 4C:
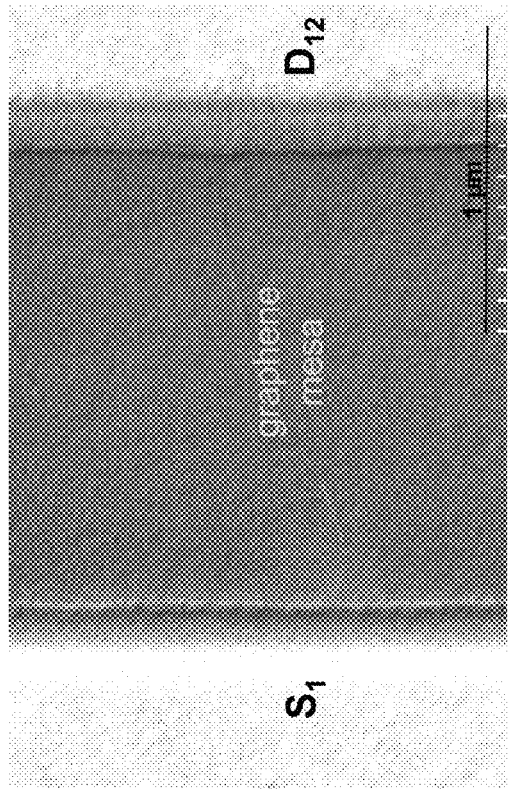
Figure 4D:
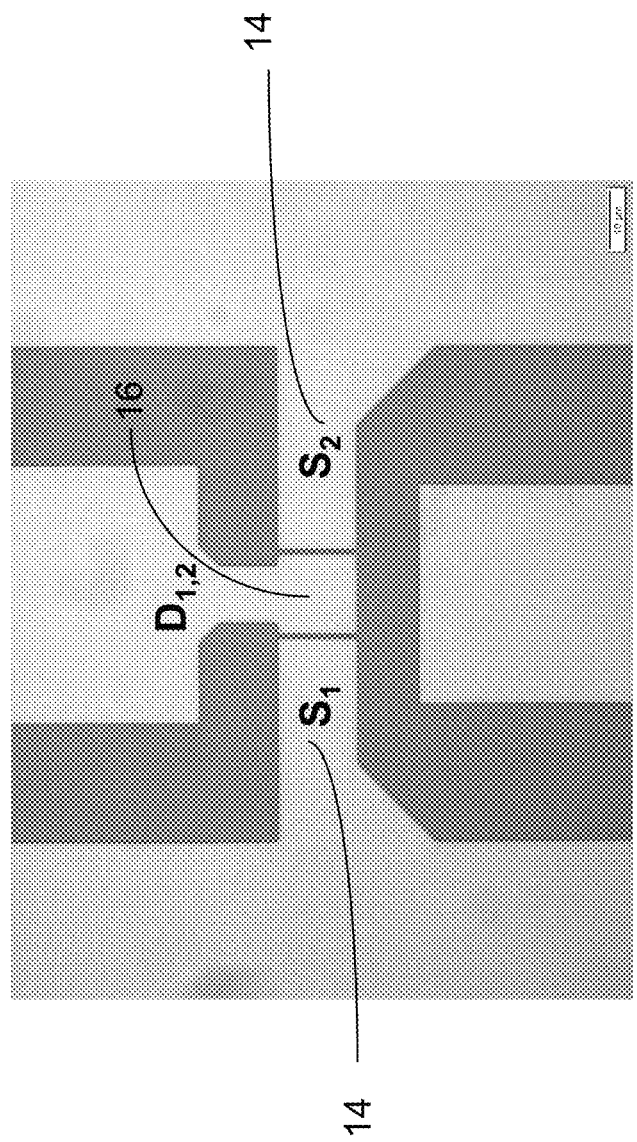
FIG. 4D shows an optical microscope image of a partially fabricated graphene LHFET with a graphene mesa and ohmic contacts for source and drain electrodes in accordance with the present disclosure.

Next, over the graphene mesas, the source contact 14 and the drain contact 16 are formed, as shown in SEM images FIGS. 4A, 4B and 4C, and as shown in the optical microscope image in FIG. 4D. The source contact 14 and the drain contact 16 are formed using a Ti/Pt/Au metal deposition by depositing Ti, then Pt and then AU and lift-off process. For graphene LHFETs on Si that have been developed, the non-alloyed ohmic metal process has resulted in a contact resistance of $R_t$~0.2 Ωmm and a contact resistivity of $R_c$~4×10$^{-7}$ Ωcm$^2$ at a sheet resistance of $R_s$~600 Ω/sq as measured with transmission line measurement (TLM) patterns. A record low contact resistance was measured having $R_t$~0.04 Ωmm and a contact resistivity of $R_c$~3×10$^{-8}$ Ωcm$^2$ at a sheet resistance of $R_s$~540 Ω/sq.

After the source contact 14 and the drain contact 16 are fabricated, a section between the source and drain contact is patterned and fluorinated to form the graphene section 34, turning the graphene mesa into the lateral heterostructure graphene channel 20 having a first graphene section Gr 30, a fluorinated graphene section GrF 34, and a second graphene section Gr 32. The graphene section 34 is exposed to XeF$_2$ for 12-24 hours to form the fluorinated graphene section GrF 34. The temperature during fluorination may be equal to or greater than 20 degrees centigrade to less than or equal to 100 degrees centigrade. A preferred temperature is 70 degrees centigrade.

The channel resistance of the resulting fluorinated graphene section GrF 34 ranges from 10 megaohms to 100 megaohms, where a megaohm is 10$_6$ ohms.

Next, a gate oxide 22, which may be up to 12 nanometer (nm) thick, and which may be HfO$_2$, is deposited between the source contact 14 and the drain contact 16 and over the exposed portions of the Gr 30 section and the Gr 32 section, and over the fluorinated graphene section GrF 34. The gate oxide 22 is also deposited on the walls of the source contact 14 and the drain contact 16 that face the gate electrode 18. Finally the gate electrode 18 is fabricated by depositing Ti, then Pt and then Au to form a Ti/Pt/Au electrode over the gate oxide 22.

Figure 5D:
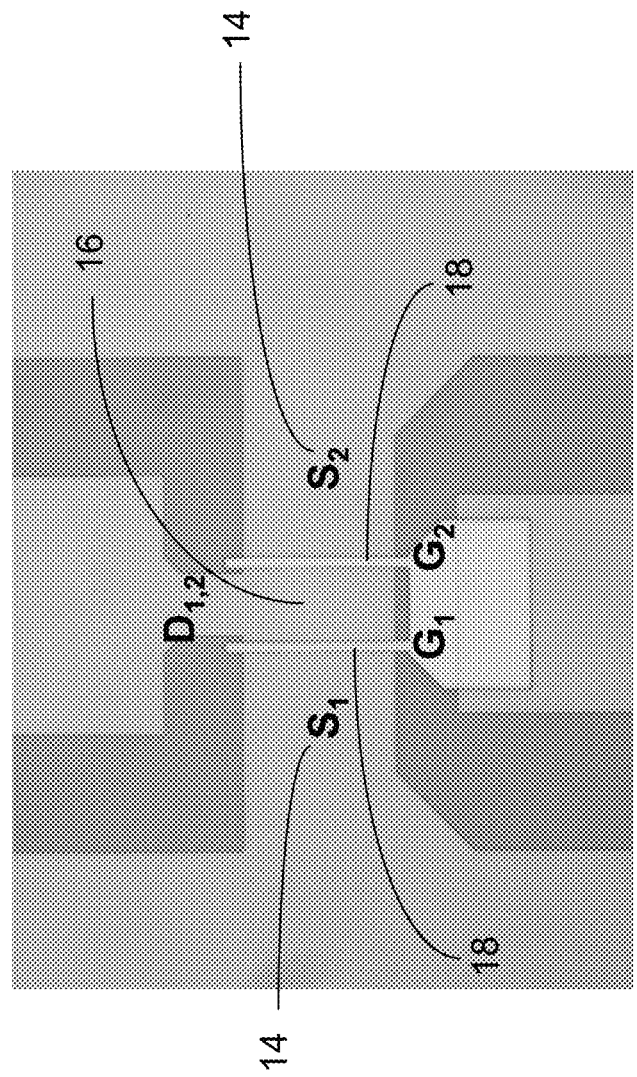
FIG. 5D shows an optical microscope image of the fabricated graphene LHFETs in accordance with the present disclosure.

FIGS. 5A, 5B and 5C show SEM images of two fabricated graphene LHFETs with ohmic contacts for source 14 and drain 16 electrodes fabricated on a graphene mesa and gate electrodes 18 fabricated over the graphene meas. FIG. 5D shows an optical microscope image of the fabricated graphene LHFETs. In the configuration shown in FIGS. 5A, 5B, 5C and 5D two graphene LHFETs are integrated in a parallel configuration with drain $D_{12}$ 16 shared by the two LHFETs.

Figure 5E:
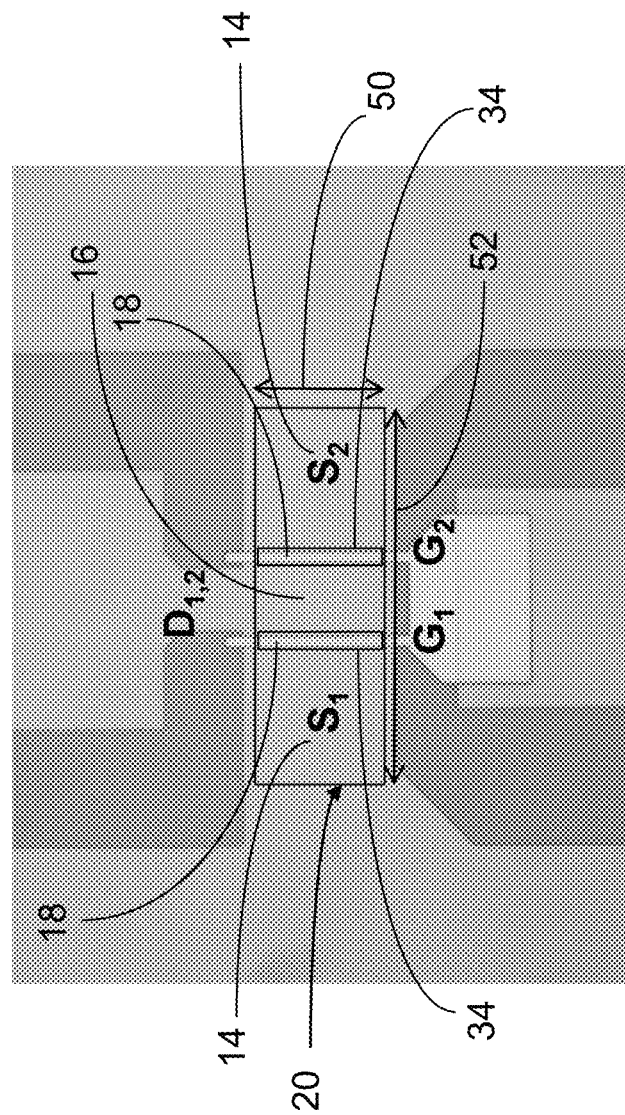
FIG. 5E shows the same optical microscope image of the fabricated graphene LHFETs as FIG. 5D with added areas indicating the location of the graphene mesa and the fluorinated graphene sections of the graphene mesa under the gate electrodes in accordance with the present disclosure.

FIG. 5E shows the same optical microscope image of the fabricated graphene LHFETs as FIG. 5D with the locations of the lateral heterostructure graphene channel 20 and the fluorinated graphene sections 34 under the gate electrodes 18 indicated, which are otherwise invisible in FIG. 5D. The lateral heterostructure graphene channel 20 may, for example, have a width 50 of 12 μm, and a length 52 of 68 μm. The source-drain length, which is the length $L_{SD}$ between the source 14 and the drain 16, may, for example, be 1 μm. The lateral length $L_G$ of the gate electrode 18 may, for example, be 0.5 μm, and the lateral length $L_{GrF}$ of the fluorinated graphene 34 may also be, for example, 0.5 μm, where lateral length is a length in a direction from the source to the drain.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . "

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other steps. Additionally, steps may be performed in any suitable order. As used in this document, "each" refers to each member of a set or each member of a subset of a set.

What is claimed is:

1. A field effect transistor comprising:
    a substrate;
    a passivation layer on the substrate providing a passivated substrate, wherein the passivation layer is inert to XeF$_2$, wherein the passivation layer is on a top, a bottom and sides of the substrate; and
    a graphene lateral heterostructure field effect transistor (LHFET) on the passivated substrate.

2. The field effect transistor of claim 1 wherein the graphene lateral heterostructure field effect transistor (LHFET) comprises:
    a lateral channel on the passivated substrate, the lateral channel comprising a first graphene section, a second graphene section, and a fluorinated graphene section between the first graphene section and the second graphene section;
    a source contact coupled to the first graphene section;
    a drain contact coupled to the second graphene section;
    a gate electrode over the fluorinated graphene section; and a gate oxide on the lateral channel and between the gate electrode and the lateral channel for insulating the lateral channel from the gate electrode.

3. The field effect transistor of claim 2 wherein the first graphene section and the second graphene section comprise an n-type doping or a p-type doping.

4. The field effect transistor of claim 1 wherein the substrate comprises Si or $SiO_2$.

5. The field effect transistor of claim 1 further comprising:
a CMOS circuit on the substrate, wherein the CMOS circuit is coupled to the graphene lateral heterostructure field effect transistor (LHFET).

6. The field effect transistor of claim 1 wherein the passivation layer comprises $HfO_2$ or $Al_2O_3$.

7. The field effect transistor of claim 2 wherein the gate oxide comprises $HfO_2$.

8. A method for providing a field effect transistor comprising:
providing a substrate;
forming a passivation layer on the substrate to form a passivated substrate, wherein the passivation layer is inert to $XeF_2$, wherein the passivation layer is on a top, a bottom and sides of the substrate; and
forming a graphene lateral heterostructure field effect transistor (LHFET) on the passivated substrate.

9. The method of claim 8 wherein forming a graphene lateral heterostructure field effect transistor (LHFET) on the passivated substrate comprises:
transferring or depositing graphene on the passivated substrate;
patterning the graphene to form a graphene mesa; and
fluorinating a section of the graphene mesa.

10. The method of claim 9 further comprising doping the graphene with n-type doping or p-type doping.

11. The method of claim 8 wherein the substrate comprises Si or $SiO_2$.

12. The method of claim 8 wherein the passivation layer comprises $HfO_2$ or $Al_2O_3$.

13. The method of claim 8 wherein the graphene lateral heterostructure field effect transistor (LHFET) comprises:
a lateral channel on the passivated substrate, the lateral channel comprising a first graphene section, a second graphene section, and a fluorinated graphene section between the first graphene section and the second graphene section;
a source contact coupled to the first graphene section;
a drain contact coupled to the second graphene section;
a gate electrode over the fluorinated graphene section; and
a gate oxide on the lateral channel and between the gate electrode and the lateral channel for insulating the lateral channel from the gate electrode.

14. The method of claim 8, wherein the method is compatible with CMOS back-end-of-line (BEOL) processes.

15. The method of claim 8,
wherein the top, bottom, and sides of the substrate include edges of the substrate;
wherein forming the passivation layer on the substrate comprises passivating the substrate on a the top, bottom, and sides with an ALD grown deposition of the passivation layer on the substrate to form the passivated substrate, the passivation layer comprising a dielectric material inert to $XeF_2$;
wherein forming the graphene lateral heterostructure field effect transistor (LHFET) on the passivated substrate comprises:
transferring or depositing graphene over the passivated substrate using a transfer method;
patterning the transferred graphene with photolithography and dry etching to create a graphene mesa;
forming a source contact on a first section of the graphene mesa;
forming a drain contact on a second section of the graphene mesa;
fluorinating with $XeF_2$ a section of the graphene mesa between the source contact and the drain contact to form a fluorinated graphene section on the graphene mesa between the first section of the graphene mesa and the second section of the graphene mesa;
depositing a gate oxide over the fluorinated graphene section; and
forming a gate electrode over the gate oxide.

16. The method of claim 15 wherein the substrate comprises Si or SiO2.

17. The method of claim 15 wherein the dielectric material comprises $HfO_2$ or $Al_2O_3$.

18. The method of claim 15 further comprising doping the graphene with n-type or p-type doping.

19. The method of claim 15 wherein forming the source contact, the drain contact and the gate electrode each comprises:
depositing Ti;
depositing Pt on the Ti;
depositing Au on the Pt; and
using a lift-off process.

20. The method of claim 15 wherein depositing the gate oxide comprises forming a gate oxide layer on the fluorinated graphene section, wherein the gate oxide layer comprises a $HfO_2$ layer up to 12 nanometers thick.

21. The method of claim 15 wherein fluorinating with $XeF_2$ a section of the graphene mesa between the source contact and the drain contact to form a fluorinated graphene section on the graphene mesa between the first section of the graphene mesa and the second section of the graphene mesa comprises:
fluorinating the section of the graphene mesa with $XeF_2$ for 12 to 24 hours at a temperature;
wherein the temperature may be equal to or greater than 20 degrees centigrade to less than or equal to 100 degrees centigrade.

* * * * *